United States Patent
Baek et al.

(10) Patent No.: US 10,446,715 B2
(45) Date of Patent: Oct. 15, 2019

(54) SEMICONDUCTOR DEVICE AND SEMICONDUCTOR DEVICE PACKAGE INCLUDING THE SAME

(71) Applicant: LG INNOTEK CO., LTD., Seoul (KR)

(72) Inventors: Kwang Sun Baek, Seoul (KR); Jong Ho Na, Seoul (KR); Dae Seob Han, Seoul (KR); Jung Hyun Hwang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 37 days.

(21) Appl. No.: 15/751,264

(22) PCT Filed: Nov. 2, 2017

(86) PCT No.: PCT/KR2017/012345
§ 371 (c)(1),
(2) Date: Feb. 8, 2018

(87) PCT Pub. No.: WO2018/212416
PCT Pub. Date: Nov. 22, 2018

(65) Prior Publication Data
US 2019/0259913 A1   Aug. 22, 2019

(30) Foreign Application Priority Data

May 19, 2017 (KR) .................. 10-2017-0062513

(51) Int. Cl.
*H01L 33/32* (2010.01)
*H01L 33/06* (2010.01)
(Continued)

(52) U.S. Cl.
CPC .............. *H01L 33/32* (2013.01); *H01L 33/06* (2013.01); *H01L 33/486* (2013.01); *H01L 33/507* (2013.01); *H01L 33/52* (2013.01)

(58) Field of Classification Search
None
See application file for complete search history.

(56) References Cited

U.S. PATENT DOCUMENTS 8,669,585 B1 * 3/2014 Chen .................. H01L 33/06
257/101
2014/0138616 A1 * 5/2014 Huang ................ H01L 33/02
257/13

(Continued)

*Primary Examiner* — J. E. Schoenholtz
(74) *Attorney, Agent, or Firm* — Birch, Stewart, Kolasch & Birch, LLP

(57) ABSTRACT

Disclosed herein is a semiconductor device. The semiconductor device includes a substrate, a first conductive type semiconductor layer disposed over the substrate, an active layer disposed over the first conductive type semiconductor layer, and a second conductive type semiconductor layer disposed over the active layer. The first conductive type semiconductor layer includes a first layer, a second layer and a third layer having different composition ratios of indium (In). The first semiconductor layer is disposed close to the active layer. The second semiconductor layer is disposed under the first semiconductor layer. The third semiconductor layer is disposed under the second semiconductor layer. In content is reduced from the active layer to the third semiconductor layer, and In content of the third semiconductor layer may be 5% or more to 10% or less of that of the active layer.

19 Claims, 9 Drawing Sheets

(51) Int. Cl.
*H01L 33/50* (2010.01)
*H01L 33/52* (2010.01)
*H01L 33/48* (2010.01)

(56) References Cited

U.S. PATENT DOCUMENTS

2017/0294554 A1* 10/2017 Tani .................. H01L 21/205
2017/0317235 A1* 11/2017 Iguchi ................ H01L 33/025

* cited by examiner

SEMICONDUCTOR DEVICE AND SEMICONDUCTOR DEVICE PACKAGE INCLUDING THE SAME

CROSS REFERENCE TO RELATED APPLICATIONS

This application is the National Phase of PCT International Application No. PCT/KR2017/012345, filed on Nov. 2, 2017, which claims priority under 35 U.S.C. 119(a) to Patent Application No. 10-2017-0062513, filed in the Republic of Korea on May 19, 2017, all of which are hereby expressly incorporated by reference into the present application.

BACKGROUND OF THE INVENTION

1. Technical Field

Embodiments relate to a semiconductor device and a semiconductor device package including the same package and, more particularly, to a semiconductor device capable of improving optical characteristics, electrical characteristics and reliability and preventing a blue shift by improving the crystallinity of a semiconductor device and a semiconductor device package including the same.

2. Description of the Related Art

A nitride semiconductor including a compound, such as GaN or AlGaN, has many advantages, such as bandgap energy that is wide and can be easily adjusted, and may be widely used in semiconductor devices, light-receiving elements and various diodes.

In particular, a light-emitting device, such as a light-emitting diode or laser diode using a 3-5 group or 2-6 group compound semiconductor material of a semiconductor, can implement various colors, such as red, green, blue and ultraviolet rays, due to the thin film growth technology and the development of device materials, can also implement a white ray having good efficiency by using a fluorescent material or combining colors, and has advantages of low consumption power, semi-permanent lifespan, a fast response speed, safety and eco-friendliness, compared to the existing light sources such as the fluorescent lamp and the light bulb.

For example, a nitride semiconductor receives much attention in the field of optical device and high-output electronic device development due to high thermal stability and wide bandgap energy. In particular, a blue light-emitting device, green light-emitting device and ultraviolet ray (UV) light-emitting device using the nitride semiconductor have been commercialized and widely used.

Furthermore, if a light-receiving element, such as a photodetector or solar cell, is fabricated using the 3-5 group or 2-6 group compound semiconductor material of a semiconductor, it generates a photoelectric current by absorbing light of various wavelength regions due to the development of device materials. Accordingly, light of various wavelength regions from the gamma ray to a radio wavelength region can be used. Furthermore, the light-receiving element can be easily used for power control, an ultra-high frequency circuit or a module for communication because it has advantages of fast response speed, safety, eco-friendliness and easy control of device materials.

Recently, as the demand for high efficiency LEDs increases, the improvement of the degree of brightness becomes an issue. In order to improve the degree of brightness of the light-emitting device, it is important to concentrate carriers on an active layer. There was proposed a technology for introducing an electron blocking layer (EBL) having a high energy level in order to trap electrons having a high mobility in the active layer.

However, there is still a problem in that efficiency is low due to a blue shift phenomenon.

SUMMARY OF THE INVENTION

Embodiments are directed to providing a semiconductor device capable of preventing the blue shift phenomenon.

Furthermore, embodiments are directed to improving the optical and/or electrical characteristics and reliability of a semiconductor device by providing a semiconductor device capable of gradually reducing stress applied to an active layer.

A semiconductor device according to an embodiment includes a substrate, a first conductive type semiconductor layer disposed over the substrate, an active layer disposed over the first conductive type semiconductor layer, and a second conductive type semiconductor layer disposed over the active layer. The first conductive type semiconductor layer includes a first layer, a second layer and a third layer having different composition ratios of indium (In). When the first conductive type semiconductor layer and the active layer are measured by Time-of-Flight secondary ion mass spectrometry (TOF-SIMS), intensity of standardized secondary ions of indium (In) ions includes a plurality of inflection points. The inflection points include a first high point and first low point appearing in the active layer, a second high point and second low point appearing in the first layer, a third high point and third low point appearing in the second layer, and a fourth high point and fourth low point appearing in the third layer. The first high point is higher than the second high point, the second high point is higher than the third high point, and the third high point is higher than the fourth high point.

In one embodiment, the intensity of the standardized secondary ions of the indium (In) ions may be higher at the second high point of the first layer than at the first low point of the active layer. The intensity of the standardized secondary ions of indium (In) ions may be higher at the third high point of the second layer than at the second low point of the first layer. The intensity of the standardized secondary ions of indium (In) ions may be higher at the fourth high point of the third layer than at the third low point of the second layer.

In one embodiment, wherein indium (In) content of the first layer may be 60% to 80% of indium (In) content of the active layer.

In one embodiment, indium (In) content of the second layer may be 20% to 30% of indium (In) content of the active layer or 30% to 40% of the indium (In) content of the first layer.

In one embodiment, the indium (In) content of the third layer may be 5% to 10% of indium (In) content of the active layer or 20% to 30% of indium (In) content of the second layer.

In one embodiment, a difference between the third high point of the second layer and the first high point of the active layer based on the first high point of the active layer may be 0.5 times a difference between the fourth high point of the third layer and the first high point of the active layer.

In one embodiment, the active layer has a superlattice structure of InGaN/GaN and may have a composition ratio of indium (In) of 14%.

In one embodiment, the first layer has a superlattice structure of InGaN/GaN and may have a composition ratio of indium (In) of 6% to 9%.

In one embodiment, the second layer has a superlattice structure of InGaN/GaN and may have a composition ratio of indium (In) of 3% to 6%.

In one embodiment, the third layer has a superlattice structure of InGaN/GaN and may have a composition ratio of indium (In) of 1% to 3%.

Figure 1:
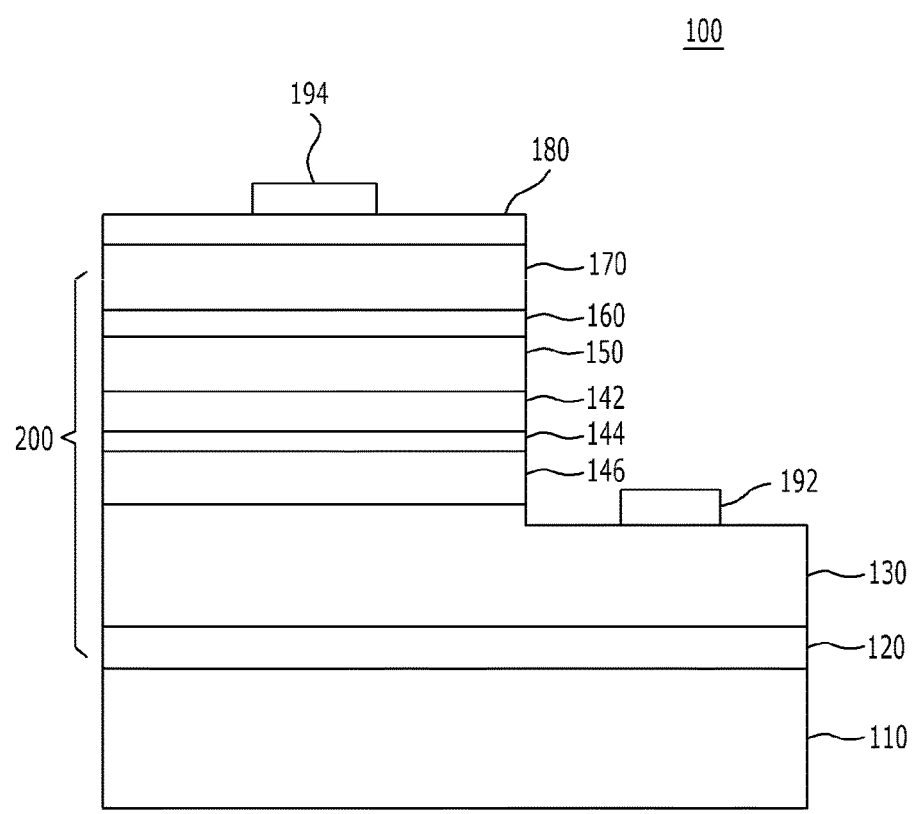
FIG. 1 is a cross-sectional view of a semiconductor device according to an embodiment of the present invention.

DESCRIPTION OF REFERENCE NUMERALS
OF PRINCIPAL ELEMENTS IN THE
DRAWINGS

110: substrate
120: buffer layer
130: first conductive type semiconductor layer
142: first semiconductor layer
144: second semiconductor layer
146: third semiconductor layer
150: active layer
160: blocking layer
170: second conductive type semiconductor layer
180: light-transmissive electrode layer
192: first electrode
194: second electrode

DETAILED DESCRIPTION

The present embodiments may be modified in other forms or several embodiments may be combined, and the scope of the present invention is not limited to each of the embodiments described hereunder.

Although contents described in a specific embodiment are not described in another embodiment, they may be construed as being a description related to another embodiment unless they are otherwise described or they contradict the description in another embodiment.

For example, if the characteristics of an element A have been described in a specific embodiment and the characteristics of an element B have been described in another embodiment, an embodiment in which the element A and the element B have been combined should be construed as belong to the range of right of the present invention if there is no opposite or contradictory description unless the embodiment is explicitly described.

Hereinafter, embodiments of the present invention capable of realizing the objects are described in detail with reference to the accompanying drawings.

In describing the embodiments of the present invention, if one element is described as being formed "on or below (over or under)" the other element, the term "on or below (over or under)" includes that the two elements come into direct contact with each other or one or more other elements are disposed between the two elements (indirectly). Furthermore, if the term "on or below (over or under)" is expressed, it may include the meaning of a downward direction based on one element in addition to an upward direction.

FIG. 1 is a cross-sectional view of a semiconductor device according to an embodiment of the present invention.

Referring to FIG. 1, a semiconductor device 100 may include a substrate 110, a semiconductor structure 200 disposed on the substrate and configured to include a first conductive type semiconductor layer 130, a second conductive type semiconductor layer 170, and an active layer 150 disposed between the first conductive type semiconductor layer 130 and the second conductive type semiconductor layer 170, and a first electrode 192 and second electrode 194 electrically connected to the semiconductor structure 200.

Furthermore, a plurality of semiconductor layers may be disposed between the first conductive type semiconductor layer 130 and the active layer. A blocking layer 160 may be disposed between the active layer 150 and the second conductive type semiconductor layer 170. The first electrode 192 may be disposed on the first conductive type semiconductor layer 130. A light-transmissive electrode layer 180 and the second electrode 194 may be disposed over the second conductive type semiconductor layer 170.

The substrate 110 may be made of a material having excellent thermal conductivity, and may be a conductive substrate or insulating substrate. For example, the substrate 110 may use at least one of sapphire (Al2O3), SiC, Si, GaAs, GaN, ZnO, GaP, InP, Ge and Ga2O3. The substrate 110 may be an AlN template, for example. A plurality of peaks (not shown) may be formed on the top and/or bottom of the substrate 110. The side section of each of the plurality of peaks has at least one of a hemispheric form, a polygon form and an oval, and the plurality of peaks may be arranged in a stripe form or matrix form. The peaks can improve light extraction efficiency.

The light-emitting structure 200 may be disposed on the substrate 110. Equipment for disposing the light-emitting structure 200 includes an e-beam deposition apparatus, physical vapor deposition (PVD), chemical vapor deposition (CVD), plasma laser deposition (PLD), dual-type thermal evaporator sputtering, and metal organic chemical vapor deposition (MOCVD), but is not limited thereto.

The light-emitting structure 200 may include a buffer layer 120, the first conductive type semiconductor layer 130, a first semiconductor layer 142, a second semiconductor layer 144, a third semiconductor layer 146, the active layer 150, the second conductive type semiconductor layer 170 and the blocking layer 160, which are described later.

The buffer layer 120 may be disposed on the substrate 110.

The buffer layer 120 reduces a lattice mismatch between the substrate 110 and the first conductive type semiconductor layer 130 and enables conductive semiconductors to be easily grown. The buffer layer 110 may be made of a 3-group-5 group compound semiconductor, for example, at least one of GaN, InN, AlN, InGaN, AlGaN, InAlGaN and AlInN. An undoped semiconductor layer (not shown) may be formed on the buffer layer.

The first conductive type semiconductor layer 130 may be disposed on the buffer layer 120.

The first conductive type semiconductor layer 130 may be implemented using a compound semiconductor, such as the III-V group or the II-VI group, and the first conductive type semiconductor layer 130 may be doped with a first dopant. The first conductive type semiconductor layer 130 may be implemented using a semiconductor material having an empirical formula of $Al_xGa_{1-x}N$ ($0 \leq x \leq 1$). For example GaN, AlN, AlGaN, InGaN, InN, InAlGaN, AlInN, AlGaAs, GaP, GaAs, GaAsP or AlGaInP may be selected as the first conductive type semiconductor layer 130. Furthermore, the first dopant may be an n type dopant, such as Si, Ge, Sn, Se or Te. If the first dopant is an n type dopant, the first conductive type semiconductor layer 130 may be an n type semiconductor layer.

The active layer 150 may be disposed over the first conductive type semiconductor layer 130.

The active layer 150 is a layer where electrons (or holes) injected through the first conductive type semiconductor layer 130 and holes (or electrons) injected through the second conductive type semiconductor layer 170 meet. The active layer 150 shifts to a low energy level as the electrons and holes are recombined, and can generate light having a specific wavelength.

The active layer 150 may have any one of a single well structure, a multi-well structure, a single quantum well structure, a multi-quantum well (MQW) structure, a quantum dot structure and a quantum wire structure, and the structure of the active layer 150 is not limited thereto.

The active layer 150 may be implemented using a compound semiconductor. The active layer 150 may be implemented using at least one of the II group-VI group compound semiconductor and the III group-V group compound semiconductor.

If the active layer 150 has been implemented to have a multi-well structure, the active layer 150 includes a plurality of well layers and a plurality of barrier layers. In this case, the well layer and the barrier layer may be alternately disposed, and a pair of the well layer and the barrier layer may be formed in 2-30 cycles. The active layer 150 may be any one or more pair structures of InGaN/GaN, InAlGaN/GaN, GaAs(InGaAs)/AlGaAs and GaP(InGaP)/AlGaP. The active layer 150 may have an InGaN/GaN stack structure or InGaN/InGaN stack structure, and indium (In) content of InGaN may be 9% or more to 14% or less. The active layer 150 may include In content corresponding to the wavelength of light to be emitted. In one embodiment, the semiconductor structure 200 having a main peak wavelength in which the relative, intensity of light is the highest in a wavelength of 410 nm or more to 470 nm or less when a light-emitting structure is measured using a photodetector, such as photoluminescence (hereinafter referred to as "PL") or an integrating sphere, is taken as an example. A relation between the semiconductor structure 200 and other elements is described.

A plurality of semiconductor layers may be disposed between the first conductive type semiconductor layer 130 and the active layer 150. The first semiconductor layer 142 may be disposed to neighbor the active layer 150. The second semiconductor layer 144 may be disposed below the first semiconductor layer. The third semiconductor layer 146 may be disposed below the second semiconductor layer. The first semiconductor layer, the second semiconductor layer and the third semiconductor layer may be superlattice layers, and may include an InGaN/GaN, AlGaN/GaN and InGaN/AlGaN structure in which an AlGaN layer, InGaN layer and GaN layer are repeatedly stacked, but is not limited thereto.

The semiconductor structure 200 may include indium (In). Indium (In) content may gradually increase from the substrate 110 to the surface direction of the semiconductor structure. For example, the In content may increase from the bottom of the semiconductor structure to the top, so the In content of the first semiconductor layer 142 may be greater than that of the third semiconductor layer 146. If the semiconductor structure 200 is a material based on GaN, the mobility of electrons and the mobility of holes may be different. The mobility of electrons may be 10 times or more to 1000 times or less higher than the mobility of holes. For example, if the first conductive type semiconductor layer 130 is an n type semiconductor including an n type dopant and the second conductive type semiconductor layer 170 is a p type semiconductor including a p type dopant, the mobility of electrons injected from the first conductive type semiconductor layer 130 to the active layer 150 is higher than the mobility of holes injected from the second conductive type semiconductor layer 170 to the active layer 150. Accordingly, a probability that electrons are injected into the second conductive type semiconductor layer 170 through the active layer 150 and recombined with holes in a non-light-emissive manner may be higher than a probability that electrons are recombined with holes in a light-emissive manner in the active layer 150. Furthermore, electrons and holes injected into the active layer 150 may be unbalanced. As a result, the optical characteristics of the semiconductor device 100 may be deteriorated. Furthermore, a semiconductor material including a GaN-based material may have a smaller energy bandgap Eg, that is, a difference between a conduction band Ec and a valence band Ev as the semiconductor material includes more In. Accordingly, an increase of the In content in a first direction from the substrate 110 to the active layer 150 may include the meaning that the energy bandgap Eg is reduced in the first direction. In one embodiment, if the semiconductor structure 200 includes a GaN-based material, stress between the substrate 110 and the active layer 150 may also be increased along the energy bandgap Eg that is reduced in the first direction because the mobility of electrons is greater than the mobility of holes. Accordingly, in the present embodiment, the plurality of semiconductor layers is disposed as the In content increases from the substrate 110 to the active layer 150. Accordingly, energy of electrons can be reduced in the first direction, the mobility of electrons and the mobility of holes can be balanced, and the probability that light-emissive recombination is performed in the active layer 150 can be increased. Furthermore, the crystallinity of the active layer 150 can be improved by distributing stress directly applied to the active layer 150 to the plurality of semiconductor layers.

If In content of the active layer 150 is 9% or more to 14% or less, In content of the first semiconductor layer 142 may be 6% or more to 9% or less, In content of the second semiconductor layer 144 may be 3% or more to 6% or less, and In content of the third semiconductor layer 146 may be 1% or more to 3% or less. As described above, the In content of the first semiconductor layer 142, the second semiconductor layer 144 and the third semiconductor layer 146 needs to be smaller based on the active layer 150.

The first semiconductor layer 142 may be disposed close to the active layer 150 compared to the second semiconductor layer 144 and the third semiconductor layer 146. If the In content of the active layer 150 is 9% or more to 14% or less, the In content of the first semiconductor layer 142 needs to be 6% or more. In this case, a phenomenon in which the wavelength of light emitted by the active layer 150 is changed in response to an applied electric current or voltage can be prevented because stress generated between the active layer 150 and the first conductive type semiconductor layer 130 is reduced. Furthermore, when the semiconductor structure 200 is measured using a photodetector, such as PL or an integrating sphere, the relative intensity of light emitted by the active layer 150 may be the strongest. If the In content of the first semiconductor layer 142 is 9% or less, the relative intensity of light of the first semiconductor layer 142 may be weaker than the intensity of light emitted by the active layer 150. If the relative intensity of light of the first semiconductor layer 142 is greater than the intensity of light emitted by the active layer 150, when the semiconductor structure 200 is measured using a photodetector, such as PL or an integrating sphere, the first semiconductor layer 142 may have an inflection point in a wavelength region shorter than the main wavelength of light emitted by the active layer 150. If the inflection point has the intensity of light relatively stronger than a wavelength corresponding to the full width at half maximum (FWHM) of the wavelength of light emitted by the active layer 150, the color reproduction ratio of the semiconductor device 100 may be reduced. Accordingly, when the In content of the active layer 150 is 9% or more to 14% or less, the In content of the first semiconductor layer 142 needs to be 6% or more to 9% or less. In this case, the stress of the semiconductor structure 200 can be reduced, and the color reproduction ratio of the semiconductor device 100 can be secured.

The second semiconductor layer 144 may be disposed as a superlattice layer. In order to reduce stress between the active layer 150 and the first conductive type semiconductor layer 130, the In content of the second semiconductor layer 144 may be 3% or more to 6% or less when the In content of the active layer 150 is 9% or more to 14% or less. If the substrate 110 is not made of the same material as the semiconductor structure 200, stress attributable to a difference in the lattice constant may be generated between the substrate 110 and the semiconductor structure 200. For example, if a sapphire substrate is used as the substrate 110 and the semiconductor structure 200 is made of a GaN-based material, great stress is generated between the semiconductor structure 200 and the substrate 110. Accordingly, the active layer 150 having the highest In content in the semiconductor structure 200 may have a high lattice constant in the semiconductor structure 200, and great stress may be generated between the substrate 110 and the active layer 150. Accordingly, the second semiconductor layer 144 may include In content of 3% or more to 6% or less in order to reduce stress between the active layer 150 and the substrate 110. The second semiconductor layer 144 can reduce the stress only when it includes the In composition of 3% or more as described above. Furthermore, if the composition of In ions in the second semiconductor layer 144 exceeds 6%, it may be higher than the composition of In ions in the first semiconductor layer 142. In this case, the energy bandgap Eg of the second semiconductor layer 144 may be greater than that of the first semiconductor layer 142. If the energy bandgap Eg of the second semiconductor layer 144 is greater than that of the first semiconductor layer 142, electrons having energy of a conduction band Ec or more corresponding to the energy bandgap Eg may not be injected from the second semiconductor layer 144 to the first semiconductor layer 142. Accordingly, in order to secure the optical and/or electrical characteristics of the semiconductor device 100, the composition of In ions in the second semiconductor layer 144 may be 3% or more to 6% or less when the In content of the active layer 150 is 9% or more to 14% or less.

When the In content of the active layer 150 is 9% or more to 14% or less, the composition of In ions in the third semiconductor layer 146 may be 1% or more to 3% or less. When the composition of In ions in the third semiconductor layer 146 is 1% or more, stress between the active layer 150 and the first conductive type semiconductor layer 130 can be reduced. Furthermore, if the composition of In ions in the third semiconductor layer 146 is 3% or less, the optical and/or electrical characteristics of the semiconductor device 100 can be secured because an electron injection characteristic for the second semiconductor layer 144 can be secured.

Figure 2:
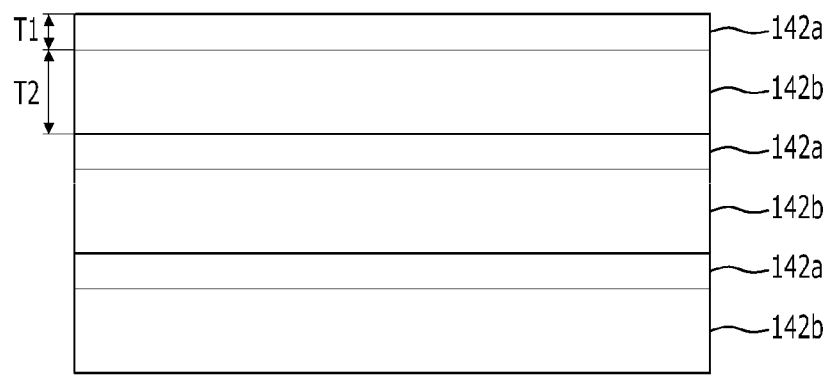
FIG. 2 is a cross-sectional view of the first layer of a semiconductor device according to an embodiment of the present invention.
Figure 3:
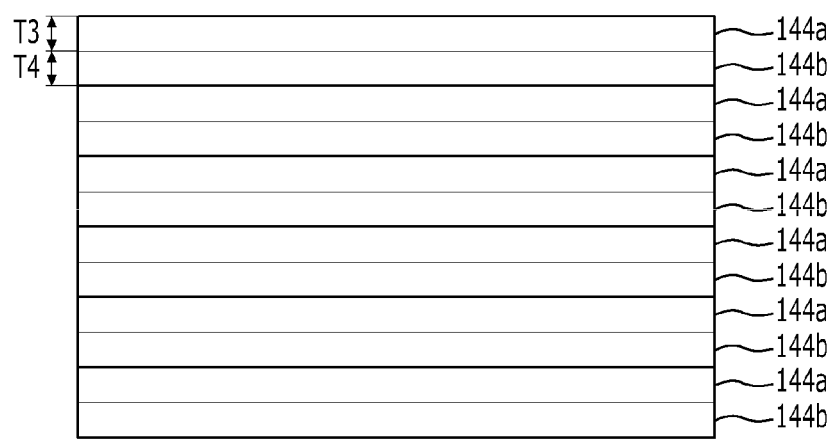
FIG. 3 is a cross-sectional view of the second layer of a semiconductor device according to an embodiment of the present invention.
Figure 4:
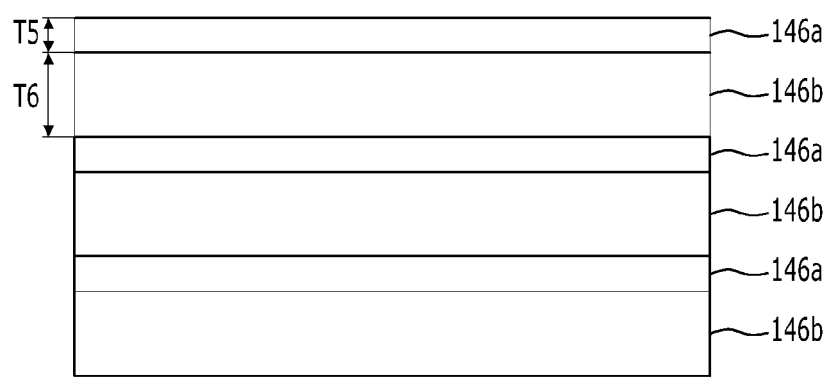
FIG. 4 is a cross-sectional view of the third layer of a semiconductor device according to an embodiment of the present invention.

FIGS. 2 to 4 are cross-sectional views showing the first to the third semiconductor layers 142, 144 and 146 in more detail.

Referring to FIG. 2, the first semiconductor layer 142 may have a structure in which 1 pair or more to 4 pairs or less of InGaN/GaN have been stacked. The InGaN layer 142a and the GaN layer 142b may have different thicknesses. When the first semiconductor layer 142 is 1 pair or more, stress between the active layer 150 and the substrate 110 can be reduced. When the first semiconductor layer 142 is 4 pairs or less, the color reproduction ratio of the semiconductor device 100 can be secured because light having relative intensity greater than the relative intensity of light corresponding to the full width at half maximum (FWHM) of light emitted by the active layer 150 is prevented from occurring. As described above, the relative intensity and FWHM of light may be a wavelength region relatively having the greatest intensity in the wavelength of light emitted by the semiconductor device 100 when the semiconductor structure 200 is measured using a photodetector, such as PL or an integrating sphere.

The ratio of the thickness T1 of the InGaN layer 142a and the thickness T2 of the GaN layer 142b may be formed in the range of 1:7 to 1:25. For example, the thickness T1 of the InGaN layer may be 2 nm to 3 nm, and the thickness T2 of the GaN layer may be 20 nm to 50 nm. When the ratio of the thickness T1 of the InGaN layer 142a and thickness T2 of the GaN layer 142b of the first semiconductor layer 142 is 1:7 or more, a piezoelectric field applied to the active layer 150 can be reduced and a phenomenon in which the emission wavelength of the active layer 150 is changed can be suppressed. Furthermore, when the ratio is 1:25 or less, the electrical and/or optical characteristics of the semiconductor device 100 can be secured because the spreading characteristic of current injected into the active layer 150 is secured.

Referring to FIG. 3, the second semiconductor layer 144 may have a superlattice structure in which InGaN/GaN have been stacked. The InGaN layer and GaN layer of the second semiconductor layer 144 may have the same thicknesses, or the GaN layer may be formed thicker than the InGaN layer. The ratio of the thickness T3 of the InGaN layer 144a and the thickness T4 of the GaN layer 144b may be formed in the range of 1:1 to 1:2. For example, the thickness T3 of the InGaN layer 144a may be 2 nm to 3 nm, and the thickness T4 of the GaN layer 144b may be 2 nm to 6 nm. When the ratio of the thickness T3 of the InGaN layer 144a and thickness T4 of the GaN layer 144b of the second semiconductor layer 144 is 1:1 or more, a strain reduction characteristic applied to the active layer 150 can be secured. When the ratio of the thickness T3 of the InGaN layer 144a and the thickness T4 of the GaN layer 144b is 1:2 or less, stress attributable to a lattice mismatch between the active layer 150 and the substrate 110 can be reduced. 3 pairs or more to 20 pairs or less of InGaN/GaN may be disposed in the second semiconductor layer 144. Stress between the active layer 150 and the substrate 110 can be reduced only when the InGaN/GaN stack structure of the second semiconductor layer 144 is disposed in 3 pairs or more. Furthermore, a function for suppressing a problem in that a potential detect attributable to a difference in the lattice constant between the substrate 110 and the semiconductor structure 200 extends up to the active layer 150 can be secured. The potential detect has a problem in that it deteriorates the electrical and/or optical characteristics and reliability of the semiconductor device 100. When the InGaN/GaN stack structure of the second semiconductor layer 144 is 3 pairs or more, the potential detect problem can be solved. If the InGaN/GaN stack structure exceeds 20 pairs, it may be difficult to secure the optical and/or electrical characteristics of the semiconductor device 100 because resistance of the second semiconductor layer 144 may increase. Accordingly, if the second semiconductor layer 144 is disposed in the InGaN/GaN stack structure, the InGaN/GaN stack structure of the second semiconductor layer 144 may be disposed in 3 pairs or more to 20 pairs or less.

Referring to FIG. 4, the third semiconductor layer 146 may have an InGaN/GaN stack structure. If the InGaN/GaN structure is stacked, it may be disposed in 1 pair or more to 5 pairs or less. The InGaN layer and the GaN layer may have different thicknesses, or the GaN layer may be formed thicker than the InGaN layer.

The ratio of the thickness T5 of the InGaN layer 146a and the thickness T6 of the GaN layer 146b may be formed in the range of 1:3 to 1:8. For example, the thickness T5 of the InGaN layer 146a of the second semiconductor layer 146 may be 2 nm to 3 nm, and the thickness T6 of the GaN layer 146b of the second semiconductor layer 146 may be 10 nm to 15 nm. In a process of disposing the third semiconductor layer 146, when the ratio of the thickness T5 of the InGaN layer 146a and thickness T6 of the GaN layer 146b of the third semiconductor layer 146 is 1:3 or more, a recess can be easily configured by controlling the growth ratio of an inclined plane between the top and side of the third semiconductor layer 146. The recess may have a shape forming a valley, including the lowest point and the inclined plane between the top and bottom of the third semiconductor layer 146. The density of the recess for the unit area of the third semiconductor layer 146 may be density capable of reducing stress between the substrate 110 and the active layer 150 and improving the crystallinity of the light-emitting structure 200 and thus preventing the shift of a wavelength emitted by the semiconductor device 100 and improving the optical and/or electrical characteristics of the semiconductor device 100 although the density has been known to those skilled in the art.

Figure 5:
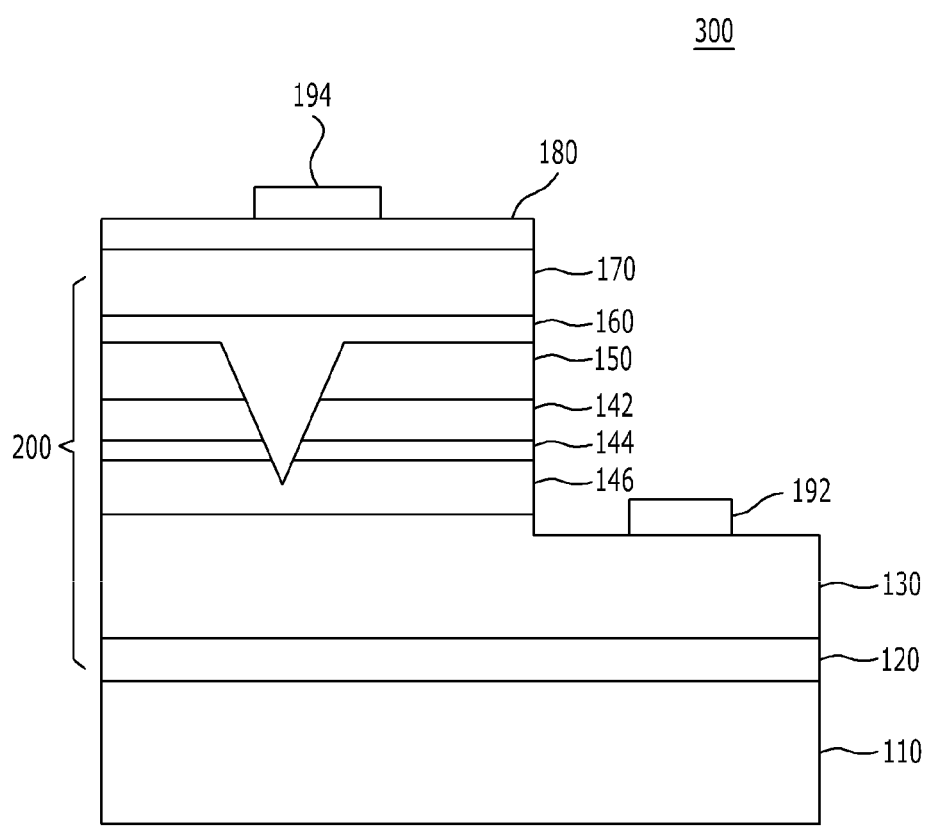
FIG. 5 is a cross-sectional view of a semiconductor device according to another embodiment of the present invention.

FIG. 5 is a cross-sectional view of the semiconductor device 100 including the recess.

The recess R may extend to the second semiconductor layer 144, the first semiconductor layer 142 and the active layer 150. The recess can improve the optical and/or electrical characteristics of the semiconductor device 100. If too many recesses are disposed, however, the electrical and/or optical characteristics and reliability of the semiconductor device 100 may be deteriorated. Furthermore, if the ratio of the thickness T5 of the InGaN layer 146a and thickness T6 of the GaN layer 146b of the third semiconductor layer 146 is 1:8 or less, the current injection characteristic of an electric current injected from the first conductive type semiconductor layer 130 to the active layer 150 through the third semiconductor layer 146 can be secured.

As described above, the In content is slowly reduced toward the first semiconductor layer 142, the second semiconductor layer 144, the third semiconductor layer 146, and the active layer 150 sequentially. Strain can be controlled and a blue shift can be prevented by controlling the In content as described above. Since the active layer 150 contains In content of 9% or more to 14% or less, it can emit a blue wavelength having the greatest relative intensity of light in the wavelength of 410 nm or more to 470 nm or less. Furthermore, since the In content of the first semiconductor layer 142, the second semiconductor layer 144 and the third semiconductor layer 146 increases toward the active layer 150, stress applied to the active layer 150 can be gradually reduced. Furthermore, the optical and/or electrical characteristics of the semiconductor device 100 can be secured because the mobility of electrons injected from the first conductive type semiconductor layer 130 to the active layer 150 and the mobility of holes injected from the second conductive type semiconductor layer 170 to the active layer 150 are balanced.

The active layer 150 may not emit the blue wavelength having the greatest relative intensity of light in the wavelength of 410 nm or more to 470 nm or less. Accordingly, assuming that In content of the active layer 150 is 100%, In content of the first semiconductor layer 142 may be 60% to 80% of that of the active layer 150 and In content of the second semiconductor layer 144 may be 30% to 40% of that of the first semiconductor layer 146 and may be 20% to 30% of that of the active layer 150.

The In content of the third semiconductor layer 142 may be 20~30% of that of the second semiconductor layer 144 and may be 5% to 10% of that of the active layer 150.

The In content of each of the first semiconductor layer 146, the second semiconductor layer 144 and the third semiconductor layer 142 may include the above range based on the active layer 150, and effects thereof may be the same as those described above.

Figure 6:
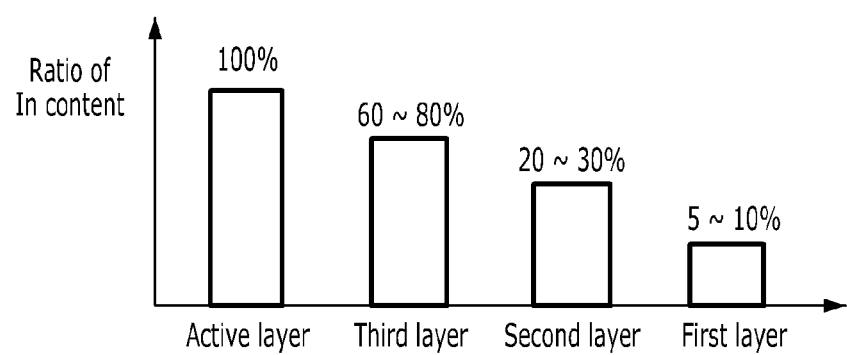
FIG. 6 shows indium (In) content from an active layer 150 to the third layer in a ratio form in the semiconductor device according to an embodiment of the present invention.

FIG. 6 shows the In content from the active layer 150 to the third semiconductor layer 146 in a ratio form.

From FIG. 6, it may be seen that assuming that the In content of the active layer is 100%, the In content of the first semiconductor layer, the second semiconductor layer, and the third semiconductor layer are 60% to 80%, 20% to 30%, and 5% to 10%, respectively, based on the active layer and are gradually reduced.

Furthermore, if the semiconductor structure 200 is made of a GaN-based material, a blocking layer 160 may be disposed between the active layer 150 and the second conductive type semiconductor layer 170.

If the semiconductor structure 200 is made of a GaN-based material, the blocking layer 160 can function as electron blocking and the MQW cladding of the active layer because the mobility of electrons and the mobility of holes are different and the mobility of electrons is higher than the mobility of holes, thereby being capable of improving emission efficiency. The role of the blocking layer 160 is not limited thereto, and the blocking layer 160 can prevent carriers having relatively high mobility from being injected into the first conductive type semiconductor layer 130 or the second conductive type semiconductor layer 170 via the active layer 150. In this case, the carriers may be electrons or holes, but are not limited thereto. Carriers having high mobility may be selected. The blocking layer 160 may have a structure in which at least 1 pair or more of InAlN/GaN layers have been stacked. The InAlN layer of the blocking layer 160 may include a second conductive type dopant. Stress attributable to a lattice mismatch can be controlled by adjusting the composition of In ions in the blocking layer 160.

The second conductive type semiconductor layer 170 is formed over the active layer 150 and may be implemented using a compound semiconductor, such as the III-V group or II-VI group. The second conductive type semiconductor layer 170 may be doped with the second dopant. The second conductive type semiconductor layer 170 may be made of a semiconductor material having an empirical formula of AlxGa1-xN (0≤x≤1) or a material selected from AlInN, AlGaAs, GaP, GaAs, GaAsP and AlGaInP. If the second dopant is a p type dopant, such as Mg, Zn, Ca, Sr or Ba, the second conductive type semiconductor layer 170 doped with the second dopant may be a p type semiconductor layer.

The light-transmissive electrode layer 180 may be disposed on the second conductive type semiconductor layer 170.

The light-transmissive electrode layer 180 may be single metal, a metal alloy or a multi-stack of metal oxide and metal nitride so that carriers can be efficiently injected and light emitted by the active layer 150 can be transmitted. For example, the light-transmissive electrode layer 180 may be made of a material having an excellent electrical contact with a semiconductor. The light-transmissive electrode layer 180 may be formed to include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), ZnO (IGZO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au and Hf, but is not limited to the materials.

The second electrode 194 is disposed on the light-transmissive electrode layer 180. The first electrode 192 is disposed on the first conductive type semiconductor layer 130 having a top partially exposed. The first electrode 192 and the second electrode 170 may be made of metal including any one of Cr, Ti, Ag, Ni, RH, Pd, Ir, Ru, Mg, Zn, Pt, Cu, Au and Hf, for example, or an alloy of them. Thereafter, the first electrode 192 and the second electrode 194 may be electrically connected, thereby completing the fabrication of a light-emitting device.

Figure 7:
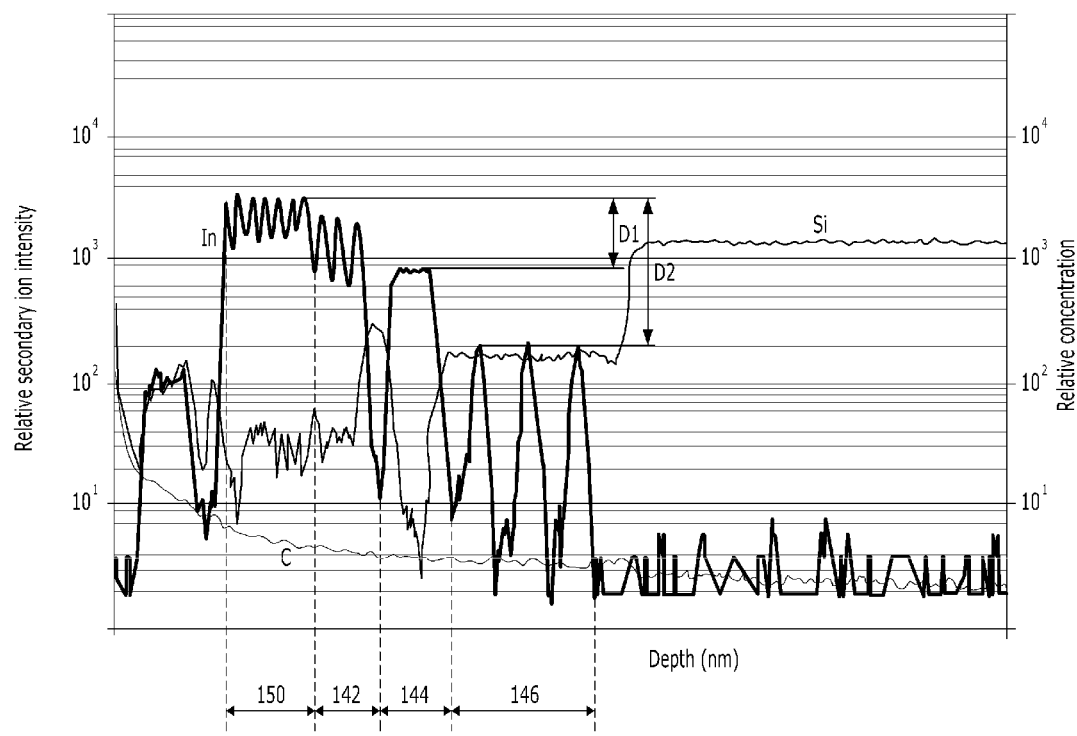
FIGS. 7 and 8 show the results of time of flight-secondary ion mass spectrometry (SIMS) of the semiconductor device according to an embodiment of the present invention.
Figure 8:
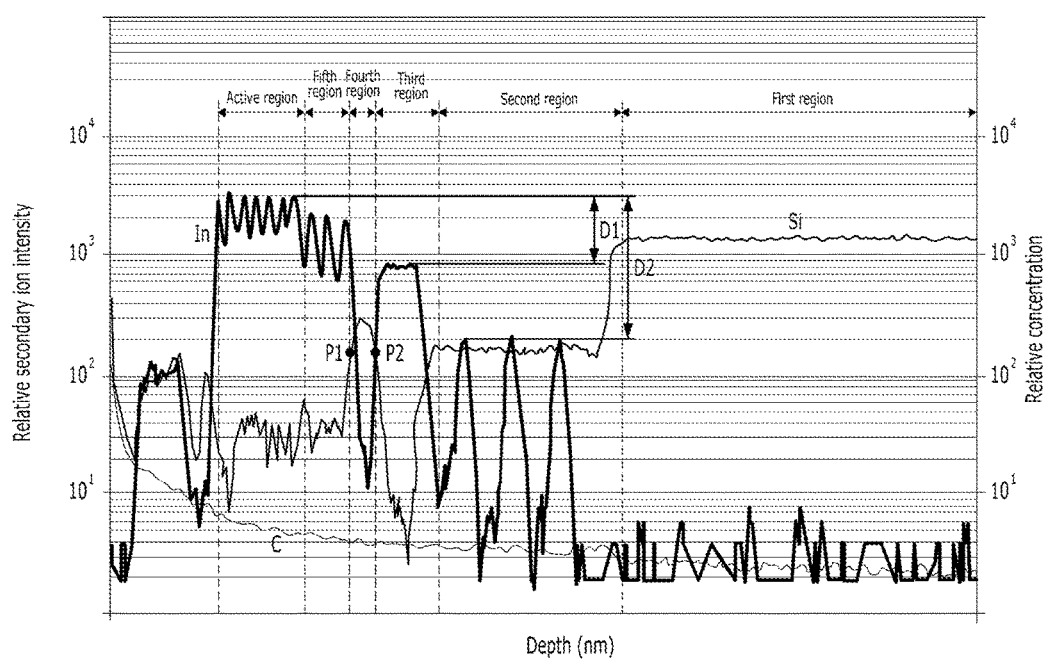

FIGS. 7 and 8 show embodiments of the present invention and the semiconductor structure 200, and are spectra showing the relative intensity of secondary ions for a thickness through the measurement of the semiconductor structure 200 using time of flight-secondary ion mass spectroscopy (TOF-SIM, hereinafter referred to as "SIMS"). The SIMS data may be analyzed by counting the number of secondary ions discharged by radiating primary ions to a surface of the light-emitting structure. In this case, $O_2^+$, $Cs^+$ or $Bi^+$ may be selected as the primary ions. An acceleration voltage may be adjusted in the range of 20 to 30 keV, a radiation current may be adjusted in the range of 0.1 pA to 5.0 pA, and a radiation area may be 20 nm×20 nm. The secondary ions are emitted by a material that forms the light-emitting structure 200, and the material may refer to In, Al, Ga, Si, Mg or C. The analysis conditions are conditions for analyzing the light-emitting structure made of a nitride-based compound semiconductor, but is not limited thereto. Any conditions for analyzing a structure made of a semiconductor may be used as the analysis conditions.

Referring to FIGS. 7 and 8, a longitudinal axis on the left shows the relative intensity of In ions detected as secondary ions. A longitudinal axis on the right shows a relative concentration of Si atoms and C atoms detected as secondary ions. Both the longitudinal axes on the left and right are based on a log scale. A first embodiment is first described based on the SIMS data shown in FIG. 7. The first embodiment is based on the semiconductor structure 200, and the semiconductor structure 200 may include the first conductive type semiconductor layer 130, the first semiconductor layer 142, the second semiconductor layer 144, the third semiconductor layer 146, the active layer 150 and the second conductive type semiconductor layer 170, which may include Si atoms and/or C atoms.

The amount of Si atoms of the third semiconductor layer 146 may be 0.05 times or more to 0.2 times or less that of the first conductive type semiconductor layer 130. When the amount of Si atoms of the third semiconductor layer 146 is 0.05 times or more that of the first conductive type semiconductor layer 130, a current injection characteristic from the first conductive type semiconductor layer 130 to the active layer 150 through the third semiconductor layer 146 can be secured. When the amount of Si atoms of the third semiconductor layer 146 is 0.2 times or less that of the first conductive type semiconductor layer 130, the current spreading characteristic of the third semiconductor layer 146 can be secured. When the current injection characteristic and the current spreading characteristic are secured, the electrical and/or optical characteristics of the semiconductor device 100 can also be secured. Accordingly, the amount of Si atoms of the third semiconductor layer 146 is in the range of 0.05 times or more to 0.2 times or less of the amount of Si atoms of the first conductive type semiconductor layer 130. Furthermore, the amount of C atoms of the third semiconductor layer 146 may be greater than that of the first conductive type semiconductor layer 130. If the semiconductor structure 200 is made of a GaN-based material, it has a characteristic that resistance rises as more C atoms are included. Accordingly, if the amount of C atoms of the third semiconductor layer 146 is greater than that of the first conductive type semiconductor layer 130 and the amount of Si atoms is smaller than that of the first conductive type semiconductor layer 130, resistance of the third semiconductor layer 146 may become high and the current spreading characteristic can be secured. Furthermore, the current injection characteristic from the first conductive type semiconductor layer 130 to the active layer 150 through the third semiconductor layer 146 can be secured only when the amount of Si atoms of the third semiconductor layer 146 falls within the range as described above.

The active layer 150, the first semiconductor layer 142, the second semiconductor layer 144 and the third semiconductor layer 146 may be different in the ion intensity according to the SIMS because they have different content of In ions.

The concentration of Si atoms may be lowered toward the second conductive type semiconductor layer 170 based on the concentration of Si atoms in the first conductive type semiconductor layer 130. The Si atoms act as dopants within the first conductive type semiconductor layer 130, so the first conductive type semiconductor layer 130 may be configured to have n type polarity. Furthermore, the Si atoms may be generally distributed within the semiconductor structure 200 because they can also function to improve the crystalline structure of the semiconductor structure 200. However, as in the embodiment, if the first conductive type semiconductor layer 130 is made of an n type semiconductor layer, a concentration of Si atoms included in the first conductive type semiconductor layer 130 may be the highest in the semiconductor structure 200.

The current injection characteristic from the first conductive type semiconductor layer 130 to the active layer 150 through the third semiconductor layer 146 can be secured only when the concentration of Si atoms of the third semiconductor layer 146 is lower than that of the first conductive type semiconductor layer 130 and higher than that of the active layer 150. Furthermore, the second semiconductor layer 144 may have the lowest concentration of Si atoms in the semiconductor structure 200. Accordingly, the spectrum of the concentration of Si atoms of the third semiconductor layer 146 for the concentrations of Si atoms of the first semiconductor layer 142 and the second semiconductor layer 144 may have an inflection point within the second semiconductor layer 144. If the second semiconductor layer 144 has a structure in which InGaN/GaN have been stacked as in the aforementioned structure, the second semiconductor layer 144 may have the lowest concentration of Si atoms in the semiconductor structure 200 in order to secure the current spreading characteristic.

The active layer 150, the first semiconductor layer 142, the second semiconductor layer 144 and the third semiconductor layer 146 have different intensities of In ions according to the SIMS because they have different concentrations of the In ions. That is, since content of In ions is the highest in the active layer 150, the intensity of the In ions is also the highest in the active layer 150, and is gradually reduced toward the first semiconductor layer 142, the second semiconductor layer 144, and the third semiconductor layer 146. The active layer 150, the first semiconductor layer 142, the second semiconductor layer 144 and the third semiconductor layer 146 may include a plurality inflection points because a layer including the In ions and a layer not including the In ions are alternately stacked. The intensity of the In ions means the intensity of the In ions emitted as secondary ions when primary ions are radiated to the semiconductor device. That is, the intensity of the In ions is the intensity of In secondary ions. Each of the layers may include inflection points for a plurality of intensities of the In ions. It may be seen that a plurality of peaks has been formed in each layer.

The inflection point may include a point at which the intensity of the In ions is higher than those at surrounding points and a point at which the intensity of the In ions is lower than those at surrounding points. The high point/low point is a point at which the slope of the graph is changed because the intensity of the In ions is higher/lower than those at surrounding points. Accordingly, a plurality of high points and low points may appear in a single layer. That is, the active layer 150, the first semiconductor layer 142, the second semiconductor layer 144 and the third semiconductor layer 146 may include a plurality of high points and low points. A plurality of high points included in the same layer may be different in ion intensity. Likewise, a plurality of low points included in the same layer may be different in ion intensity.

The high point and the low point mean inflection points appearing the regions of the active layer 150, the first semiconductor layer 142, the second semiconductor layer 144 and the third semiconductor layer 146, and do not include an inflection point appearing at the boundary between the layers. For example, a downward point at which the slope of the intensity of In ions is smaller than those at surrounding other points in the boundary surface between the first semiconductor layer 142 and the second semiconductor layer 144, but such a point is not included in a low point defined in the embodiment.

Ionization intensity is the strongest in the active layer 150 because the active layer 150 includes the largest content of In ions. That is, a high point appearing in the active layer may be higher than high points appearing in the first semiconductor layer, the second semiconductor layer and the third semiconductor layer. A low point appearing in the active layer may be higher than low points appearing in the first semiconductor layer, the second semiconductor layer and the third semiconductor layer.

A plurality of first high points and a plurality of first low points appear in the active layer 150. A plurality of second high points and a plurality of second low points may appear in the first semiconductor layer 142. A plurality of third high points and a plurality of third low points may appear in the second semiconductor layer 144. A plurality of fourth high points and the plurality of fourth low points may appear in the third semiconductor layer 146.

The second high point may be lower than the first high point, the third high point may be lower than the second high point, and the fourth high point may be lower than the third high point.

The second high point may be higher than the first low point, the third high point may be higher than the second low point, and the fourth high point may be higher than the third low point.

The content of In ions of the first semiconductor layer 142 is 60% to 80% of that of the active layer, the content of In ions of the second semiconductor layer 144 is 30% to 40% of that of the active layer, and the content of In ions of the third semiconductor layer 146 is 20% to 30% of that of the active layer. Accordingly, it may be seen that SIMS analysis values are similar.

Stress generated between the active layer 150 and the first conductive type semiconductor layer 130 can be reduced only when the intensity of In ions of the first semiconductor layer 142 is 60% or more of that of the active layer 150. Accordingly, a phenomenon in which the wavelength of light emitted by the active layer 150 is changed by an applied current or voltage can be prevented. Furthermore, when the semiconductor structure 200 is measured using a photodetector, such as PL or an integrating sphere, the relative intensity of light emitted by the active layer 150 may be the strongest. When the intensity of In ions of the first semiconductor layer 142 is 80% or less of that of the active layer 150, the relative intensity of light of the first semiconductor layer 142 may be smaller than the intensity of light emitted by the active layer 150. If the relative intensity of light of the first semiconductor layer 142 is greater than the intensity of light emitted by the active layer 150, when the semiconductor structure 200 is measured using a photodetector, such as an PL or an integrating sphere, the first semiconductor layer 142 may have an inflection point in the region of a wavelength shorter than the main wavelength of light emitted by the active layer 150. If the inflection point has the intensity of light relatively stronger than that of a wavelength corresponding to the FWHM of the wavelength of light emitted by the active layer 150, the color reproduction ratio of the semiconductor device 100 may be deteriorated. Accordingly, stress applied to the semiconductor structure 200 can be reduced and the color reproduction ratio of the semiconductor device 100 can be secured only when the intensity of In ions of the first semiconductor layer 142 is 60% or more to 80% or less of that of the active layer 150.

In order to reduce stress between the active layer 150 and the first conductive type semiconductor layer 130, the intensity of In ions of the second semiconductor layer 144 may be 30% or more to 40% or less of that of the active layer 150. If the substrate 110 is not made of the same material as the semiconductor structure 200, stress attributable to a difference in the lattice constant may be generated between the substrate 110 and the semiconductor structure 200. For example, if a sapphire substrate is used as the substrate 110 and the semiconductor structure 200 is made of a GaN-based material, great stress is generated between the semiconductor structure 200 and the substrate 110. Accordingly, the active layer 150 having the highest intensity of In ions in the semiconductor structure 200 may have the largest lattice constant in the semiconductor structure 200, and great stress may be generated between the substrate 110 and the active layer 150. Accordingly, the intensity of In ions of the second semiconductor layer 144 is made to become 30% or more to 40% or less of that of the active layer 150, thereby being capable of reducing stress between the active layer 150 and the substrate 110. The second semiconductor layer 144, as described above, can reduce stress only when it has the intensity of In ions that is 30% or more of that of the active layer 150. Furthermore, if the intensity of In ions of the second semiconductor layer 144 exceeds 40% compared to the active layer 150, it may be higher than the intensity of In ions of the first semiconductor layer 142, and thus the energy bandgap Eg of the second semiconductor layer 144 may be greater than that of the first semiconductor layer 142. If the energy bandgap Eg of the second semiconductor layer 144 is greater than that of the first semiconductor layer 142, electrons having energy of a conduction band Ec or higher corresponding to the energy bandgap Eg may not be injected from the second semiconductor layer 144 to the first semiconductor layer 142. Accordingly, in order to secure the optical and/or electrical characteristics of the semiconductor device 100, the intensity of In ions of the second semiconductor layer 144 may be 30% or more to 40% or less of that of the active layer 150.

The intensity of In ions of the third semiconductor layer 146 may be 20% or more to 30% or less of that of the active layer 150. When the intensity of In ions of the third semiconductor layer is 20% or more of that of the active layer 150, stress between the active layer 150 and the first conductive type semiconductor layer 130 can be reduced. Furthermore, when the intensity of In ions of the third semiconductor layer is 30% or less of the active layer 150, the optical and/or electrical characteristics of the semiconductor device 100 can be secured because the electron injection characteristic for the second semiconductor layer 144 can be secured.

A difference D1 between the first high point of the active layer 150 and the second high point of the second semiconductor layer 144 may be 0.5 times the difference D2 between the first high point of the active layer and the fourth point of the third semiconductor layer 146. That is, a relation "D1=0.5D2" may be established.

Hereinafter, a second embodiment based on the SIMS data of FIG. 8 is described.

The second embodiment may be based on the semiconductor structure 200, but is not limited thereto. In this case, the second embodiment may be generally applied to all of structures made of a semiconductor. Accordingly, the first conductive type semiconductor layer 130, the first semiconductor layer 142, the second semiconductor layer 144, the third semiconductor layer 146, the active layer 150, the second conductive type semiconductor layer 170, the semiconductor structure 200, etc., that is, the terms used for the description of the first embodiment, are not used in the description of the second embodiment. A light-emitting structure is used as a term that may substitute the semiconductor structure 200. Accordingly, the light-emitting structure may be the semiconductor structure 200 or may be the semiconductor device 100 in a broad sense.

The light-emitting structure may include a first region having the relatively highest concentration of Si atoms in the light-emitting structure. A second region having a concentration of Si atoms of 0.05 times or more to 0.2 times or less of that of the first region may be disposed at a close distance from the first region in a first direction. In this case, the first direction may be a direction directed from the first region to a surface of the light-emitting structure. When a concentration of Si atoms in the second region is 0.05 times or more that in the first region, current injection efficiency from the first region to an active region through the second region can be secured. When a concentration of Si atoms in the second region is 0.2 times or less that in the first region, the current spreading characteristic of the second region can be secured. When the current injection characteristic and the current spreading characteristic are secured, the electrical and/or optical characteristics of the light-emitting structure can also be secured. Accordingly, the concentration of Si atoms in the second region may be in the range of 0.05 times or more to 0.2 times or less of that in the first region. Furthermore, the concentration of Si atoms in each of the first region and the second region may be a relatively uniform concentration of 10% or less based on a low point. Since the concentration of Si atoms is different in the first region and the second region, the concentration of the Si atoms may suddenly drop in the region in which the first region and the second region come into contact with each other. In the present embodiment, an example in which each of the first region and the second region has a relatively uniform concentration of Si atoms of 10% or less based on a low point as described above is described.

Furthermore, the concentration of C atoms in the second region may be higher than the concentration of C atoms in the first region. If the light-emitting structure is made of a GaN-based material, it is characterized in which resistance increases as more C atoms are included. If the concentration of C atoms in the second region is higher than the concentration of C atoms in the first region and the concentration of Si atoms is lower than the concentration of Si atoms in the first region, resistance in the second region may be controlled so that it is increased, thereby being capable of securing the current spreading characteristic. Furthermore, the current injection characteristic toward the active region can be secured only when the concentration of Si atoms in the second region falls within the above range as described above.

A third region and a fourth region may be sequentially disposed close to the second region in the first direction. Furthermore, the active region may be disposed close to the fourth region in the first direction. A second conductive type semiconductor region may be disposed between the active region and the surface. Furthermore, the first region to the fourth region may correspond to a first conductive type semiconductor region for injecting an electric current into the active region. Accordingly, like the semiconductor structure 200 according to the first embodiment, the light-emitting structure according to the present embodiment may include the first conductive type semiconductor region playing the role of the first conductive type semiconductor layer, the second conductive type semiconductor region playing the role of the second conductive type semiconductor layer, and the active region playing the role of the active layer 150 between the first conductive type semiconductor layer and the second conductive type semiconductor layer. The light-emitting structure can form a light-emitting device that emits light through the recombination of electrons injected from the first conductive type semiconductor layer to the active region and holes injected from the second conductive type semiconductor layer to the active region.

A first point that is spaced apart from the second region in the first direction and that has the same concentration of Si atoms as the lowest concentration of the concentrations of Si atoms in the second region may be disposed. The third region may be disposed between the second region and the first point. The third region may include the section in which a concentration of Si atoms decreases in the first direction and the section in which a concentration of Si atoms increases in the first direction. A second point at which a concentration of Si atoms is the lowest may be further included between the two sections. The second point may have the lowest concentration of Si atoms in the light-emitting structure. Since the third region includes the second point, an electric current injected into the active region is prevented from being concentrated on some regions. Accordingly, the current spreading characteristic can be further secured, thereby being capable of solving a problem in that the light-emitting structure is deteriorated. Furthermore, the optical and/or electrical characteristics of the light-emitting structure can be improved.

A third point that is spaced apart from the first point in the first direction and that has the same concentration of Si atoms as the concentration of Si atoms at the first point. The fourth region may be disposed between the first point and the third point. The fourth region may have a concentration of Si atoms that is higher than the concentration of Si atoms in the second region and lower than the concentration of Si atoms in the first region. Furthermore, the fourth region may further include the section in which the concentration of Si atoms increases and the section in which the concentration of Si atoms decreases in the first direction. The fourth region may be disposed between the third region and the active region in order to secure the current spreading characteristic by compensating for injection efficiency of electrons to be injected from the first to third regions to the active region.

If secondary ions detected through SIMS are indium (In) ions, the intensity of In ions in the first to the fourth regions and the active region are described.

The intensity of In ions may be the greatest in the active region of the light-emitting structure. The intensity of In ions in the active region may be different depending on the wavelength of emitting light. If the light-emitting structure and the substrate have different lattice constants, in order to reduce stress applied to the active region and to improve the crystalline structure of the light-emitting structure, a plurality of semiconductor regions having different intensities of In ions may be disposed between the active region and the substrate. More specifically, if the light-emitting structure is made of a GaN-based compound semiconductor and the substrate is made of a material, such as sapphire, the light-emitting structure and the substrate may have different lattice constants and stress may be applied to the light-emitting structure. In this case, if the semiconductor regions included in the light-emitting structure have different intensities of In ions, the semiconductor regions may also have different lattice constants and stress may also be applied to the active region. When stress is applied to the active region, the wavelength of emitting light may be shifted. That is, if the light-emitting structure made of a GaN-based compound semiconductor layer has the intensity of In ions only in the active region, optical and/or electrical characteristics, such as that the crystalline structure of the active region is deteriorated or the wavelength of emitting light is shifted in the active region, and reliability of the light-emitting structure may be deteriorated. Accordingly, the size of stress applied to the active region can be reduced by disposing a semiconductor region having the intensity of In ions lower than the intensity of In ions in the active region between the active region and the substrate. Furthermore, the optical and/or electrical characteristics and reliability of the light-emitting structure can be improved by securing the crystallinity of the active region.

The intensity of In ions in the active region may be the highest in the light-emitting structure. Furthermore, the region in which the intensity of In ions decreases in the first direction and the region in which the intensity of In ions increases in the first direction may be disposed in a plural number. Accordingly, the intensity of In ions in the active region may have a plurality of inflection points, and the plurality of inflection points may have a plurality of first high points and a plurality of first low points. The first high point at which the intensity of In ions is the strongest may be a well layer in which electrons and holes are recombined in an emissive manner. In this case, the plurality of first high points may have the same intensity of In ions, but is not limited thereto and may have different intensities of In ions. If the plurality of first high points has the same intensity of In ions, they may have different intensities of In ions of 5% or less due to a process deviation. If the plurality of first high points has different intensities of In ions, the intensity of In ions may increase or decrease in the first direction, but the present invention is not limited thereto.

The active region may have a plurality of first low points between a plurality of high points. The plurality of first low points may be a region in which content of In ions is relatively small, and may act as a barrier layer. Furthermore, the plurality of first low points may be gradually lowered in the first direction and may have the same intensity of In ions. If the plurality of first low points is gradually lowered in the first direction, electrons may pass by in a surface direction without being subjected to emissive recombination within the active region due to a difference between the mobility of electrons injected from the first region and the mobility of holes injected into the active region. If the plurality of first low points is gradually lowered in the first direction as described above, an emissive recombination ratio within the active region can be increased because energy of electrons injected into the active region is reduced.

A fifth region may be disposed between the fourth region and a high point that belongs to the first high points of the active region and that is most distant from the surface in a second direction. In this case, the second direction may be opposite the first direction. The fifth region may include the region in which the intensity of In ions increases in the first direction in the fourth region and the region in which the intensity of In ions decreases in the first direction in the fourth region. A plurality of inflection points may be disposed in the region in which the two regions come into contact with each other. The plurality of inflection points may include a plurality of second high points and a plurality of second low points. The intensity of In ions at the second high point of the fifth region may be greater than the intensity of In ions at the first low point of the active layer and may be smaller than the intensity of In ions at the first high point. The intensity of In ions in the active region may be determined depending on the wavelength of light to be emitted. The fifth region may include the second high point lower than the first high point and higher than the first low point so that stress is applied to the active region by the intensity of In ions in the active region, the crystallinity is also deteriorated or electrons injected into the active region are distributed in a single layer as uniform as possible.

The fourth region may include a section lowering in the first direction and a section rising in the first direction, and may include an inflection point disposed between the two sections. The inflection point may include only a third low point without a high point. The third low point may be a section disposed to be similar to a semiconductor material forming the first region as possible by lowering the composition of In ions in the fourth region. As described above, the fourth region may function to inject electrons into the active region. In this case, the fourth region may be disposed to have the third low point in order to reduce stress attributable to the intensity of In ions.

The third region may include the region in which the intensity of In ions increases in the first direction and the region in which the intensity of In ions decreases in the first direction in a region close to the second region, and may include a plurality of inflection points disposed between the two regions. The plurality of inflection points may include at least one fourth high point and at least one fourth low point or may include only a single fourth high point. The intensity of In ions in the third region may function to control stress between the fifth region and the first region and to prevent a defect (e.g., a threading dislocation) extending in the first direction in the first region. The intensities of In ions at the fourth high points may be different or the same, but the present invention is not limited thereto. The fourth high point has higher intensity of In ions than a low point that belongs to the second low points of the fifth region and that is the lowest and lower intensity of In ions than the second high point, thereby being capable of controlling stress applied to the active region. The interval between the fourth high point and the fourth low point may be narrower than the least distance between the first high point and first low point of the active region and the least distance between the second high point and second low point of the fifth region. Accordingly, the third region may have a structure in which very thin semiconductor materials having different lattice constants have been stacked, and may be a superlattice layer, for example. If the third region is made of a superlattice layer, it may function to improve the current spreading characteristic and to reduce defect density extending from the first region to the active region.

The second region may have the section in which the intensity of In ions increases and the section in which the intensity of In ions decreases in the first direction in a region close to the first region, and may include a plurality of inflection points. The plurality of inflection points may include a fifth high point and a fifth low point. The second region may have a plurality of fifth high points in order to reduce stress applied to the active region and to secure crystallinity. The fifth high point may have lower intensity of In ions than the first to the fourth high points. The fifth high point may be disposed in the region in which a concentration of Si atoms is uniform.

The first high point may be determined depending on the wavelength of light emitted in the active region. The second to fifth high points may have the intensity of In ions that gradually decreases in the second direction in order to reduce stress applied to the active region and to improve crystallinity. A first ratio of the intensities of In ions between the fourth high points of the third region to the intensity of In ions at the first high point of the active region may be 0.3 times or more to 0.4 times or less. If the first ratio is less than 0.3 times, stress applied to the active region may be increased and the crystallinity of the active region may also be deteriorated. Furthermore, if the first ratio exceeds 0.4 times, a problem in that the crystallinity of all of a plurality of semiconductor layers disposed in the first direction in the third region is deteriorated because the crystallinity of the third region is deteriorated may be generated.

A second ratio of the intensity of In ions at the fifth high point of the second region to the intensity of In ions at the first high point of the active region may be 0.2 times or more to 0.3 times or less. If the second ratio is less than 0.2 times, stress applied to the active region may be increased and the crystallinity of the active region may also be deteriorated. Furthermore, if the second ratio exceeds 0.3 times, a problem in that the crystallinity of all of a plurality of semiconductor layers disposed in the first direction in the second region is deteriorated because the crystallinity of the second region is deteriorated may be generated.

The first embodiment and the second embodiment based on the SIMS data of FIGS. 7 and 8 have been described so far. In this case, although the first embodiment has been described based on the semiconductor structure 200 and the second embodiment has been described based on the light-emitting structure, the second embodiment may also be applied to the semiconductor structure 200 as described above.

Hereinafter, assuming that the reference numeral and region of each layer have not been shown based on the SIMS data of FIGS. 7 and 8, a method of distinguishing between the layers through SIMS data is described.

The terms used in the description of FIG. 7 are identically used, for convenience of description, but the terms used in the description of FIG. 7 may also be identically applied.

The active layer 150 may be checked through the relative intensity spectrum of In ions. More specifically, the active layer 150 may be located between a point that is first met when moving in the surface direction (left) from a point at which the relative intensity of In ions is the lowest and that has the same relative intensity of In ions and a point that is first met when moving in the depth direction (right) from the point at which the relative intensity of In ions is the lowest and that has the same relative intensity of In ions, from among points belonging to about −70% to −90%, preferably, about −80% in a longitudinal axis from a point at which the relative intensity of In ions is the highest.

For example, assuming that a point that belongs to points belonging to about −80% in the longitudinal axis from a point at which the relative intensity of In ions is the highest and that has the lowest relative intensity is a point "a", the active layer 150 may be located between the first point in the surface direction having the same relative intensity as the relative intensity of In ions at the point "a" and the point "d" in the depth direction.

This is described based on FIG. 7. The point having the highest relative intensity of In ions is a second high point on the right of letter "In" in FIG. 7. The point that belongs to points belongs to about −80% in the longitudinal axis from the corresponding high point and that has the lowest relative intensity is a ninth low point on the right of the letters "In" in FIG. 7. Accordingly, the active layer 150 may be located between points that are first met when moving in the surface direction and the depth direction based on the corresponding low point and that have the same relative intensity. This may be checked from FIG. 7 in which the active layer 150 is included between the corresponding points.

If a point that belongs to points belonging to about −80% in the longitudinal axis from the point having the highest relative intensity of In ions and that has the lowest relative intensity is selected, it is to be noted that the longitudinal axis of the SIMS data has been shown in a log scale form. Accordingly, even a point belonging to about −80% in the longitudinal axis may not greatly fall from a point having the highest relative intensity of In ions in the spectrum.

The third semiconductor layer 146 may be checked through the relative intensity spectrum of In ions and the relative concentration spectrum of Si atoms. More specifically, it may be seen that the relative concentration spectrum of Si atoms is high in the depth direction. The third semiconductor layer 146 may be disposed between a point that is the deepest in the depth direction and a point that is first met, when moving in the surface direction from the point at which the relative intensity of In ions belonging to about −20% to −30%, preferably, about −25% is the highest in the traverse axis from a corresponding point, and that has the same relative intensity, from among points belonging to about −80% to −90%, preferably, about −87% in the longitudinal axis from a point at which the relative concentration of Si atoms is the highest and points at which the relative concentration of Si atoms is low.

For example, assuming that a point belonging to points having low relative intensity and deepest in the depth direction is a point "b" and a point belonging to about −25% in the traverse axis at the point "b" and having the highest relative intensity of In ions is called a point "c", from among points belonging to about −87% in the longitudinal axis from a point at which the relative concentration of Si atoms is the highest, the third semiconductor layer 146 may be located between first points in the surface direction that has the same relative intensity as the relative intensity of In ions at the point "c."

This is described based on FIG. 7. The point having the highest relative concentration of Si atoms is a point at which letters "Si" in FIG. 7 are written. The point that belongs to points having the lowest relative intensity and that is the deepest in the depth direction, from among the points belonging to about −87% in the longitudinal axis from the corresponding point, is a point at which a portion where the downward arrow of D2 is located and the spectrum of Si atoms are met. Furthermore, the point at which the relative intensity of In ions belonging to about −25% in the traverse axis at the corresponding point is the highest is a point at which a portion where the downward arrow of D2 is located and the spectrum of In ions are met. The first point in the surface direction that has the same relative intensity as the relative intensity of In ions at the corresponding point is a point at which the last "4" of reference numeral "144" in FIG. 4 is located. The third semiconductor layer 146 may be located between the points. This may be seen from FIG. 7 that the third semiconductor layer 146 has been included between the corresponding points. The third semiconductor layer 146 may be considered to be MT-GaN.

If a point that belongs to points belonging to about −87% in the longitudinal axis from a point having the highest relative concentration of Si atoms and that has the lowest relative intensity is selected, it is to be noted that the longitudinal axis of the SIMS data has been shown in a log scale form. Accordingly, even a point belonging to about −87% in the longitudinal axis may not greatly fall from the point having the highest relative concentration of Si atoms in the spectrum.

The first semiconductor layer 142 may be checked through the relative concentration spectrum of Si atoms. More specifically, the first semiconductor layer 142 may be located between a point closest in the surface direction other than the active layer 150 when moving in the surface direction from the point having the highest relative concentration of Si atoms in the third semiconductor layer 146 checked above and a point that is first met when moving in the depth direction from the corresponding point and that has the same relative concentration.

For example, assuming that a point having the highest relative concentration of Si atoms in the third semiconductor layer 146 is a point "d" and a point closest in the surface direction other than the active layer 150 when moving in the surface direction from the point "d" is a point "e", the first semiconductor layer 142 may be located between the first points in the depth direction that have the same relative concentration as the relative concentration of Si atoms at the point "e."

This is described based on FIG. 7. The point having the highest relative concentration of Si atoms in the third semiconductor layer 146 corresponds to a high point on the most right side of the In ion spectrum. A point closest in the surface direction other than the active layer 150 when moving in the surface direction based on the corresponding high point is a point at which the In ion spectrum and the Si atom spectrum intersect. Furthermore, the first point in the depth direction that has the same relative concentration as the relative concentration of Si atoms at the corresponding point is a point at which the In ion spectrum and Si atom spectrum on the most right side of the corresponding point intersect. The first semiconductor layer 142 may be located between them. This may be seen from FIG. 7 that the first semiconductor layer 142 has been included. The first semiconductor layer 142 may be considered to be an n-injector.

The methods of distinguishing between the layers of the semiconductor structure 200 according to the embodiment, more specifically, the active layer 150, the first semiconductor layer 142 and the third semiconductor layer 146 based on the spectrum shown in the SIMS data have been described so far. The second semiconductor layer 144 may be considered to be located between the first semiconductor layer 142 and the third semiconductor layer 146. The second semiconductor layer 144 may be considered to be un-InGaN rarely including Si atoms.

In the description in distinguishing between the active layer 150, the first semiconductor layer 142 and the third semiconductor layer 146 based on FIG. 7, the depth of each layer is partially different from that of the active layer 150, the first semiconductor layer 142 and the third semiconductor layer 146 shown in FIG. 7. Such a difference is generated because the depth of each layer shown in FIG. 7 is illustrative. The layers of the semiconductor structure 200 according to the embodiment may be distinguished through the aforementioned method. This may also be universally applied to other semiconductor structures.

Figure 9:
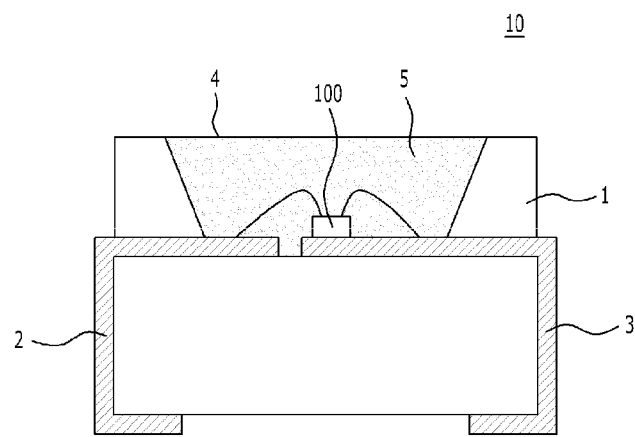
FIG. 9 is a cross-sectional view of a semiconductor device package according to an embodiment of the present invention.

FIG. 9 is a cross-sectional view showing a semiconductor device package including the semiconductor device 100 according to an embodiment of the present invention.

Referring to FIG. 9, the semiconductor device package 10 includes a package body unit 1, a first lead electrode 2 and second lead electrode 3 disposed in the package body unit 1, a semiconductor device 100 electrically connected to the first lead electrode 2 and the second lead electrode 3, and a molding member 4 configured to surround the semiconductor device 100.

The package body unit 1 may be formed to include a silicon material, synthetic material or metal material. An inclined plane may be formed on the main surface of the semiconductor device 100.

The first lead electrode 2 and the second lead electrode 3 are electrically separated and function to provide power to the semiconductor device 100. Furthermore, the third lead electrode 2 and the second lead electrode 3 may function to increase light efficiency by reflecting light generated by the semiconductor device 100, and may also function to externally discharge heat generated by the semiconductor device 100.

The semiconductor device 100 may be disposed on the package body unit 1 or may be disposed on the third lead electrode 2 or the second electrode layer 3.

The semiconductor device 100 may be electrically connected to the first lead electrode 2 and the second lead electrode 3 using any one of a wire method, flip-chip method and die bonding method. In the embodiment, the semiconductor device 100 has been illustrated as being electrically connected to the first lead electrode 2 and the second lead electrode 3 through respective wires, but is not limited thereto.

The molding member 4 may protect the semiconductor device 100 by surrounding the semiconductor device 100. Furthermore, the molding member 4 includes a fluorescent material 5 and may change the wavelength of light emitted by the semiconductor device 100.

The aforementioned semiconductor device may be configured into a light-emitting device package and used as the light source of a lighting system. For example, the semiconductor device may be used for the light source of an image display device or the light source of a lighting device.

If the semiconductor device is used as the backlight unit of an image display device, it may be used as a backlight unit of an edge type or a backlight unit of a direct type. If the semiconductor device is used as the light source of a lighting device, it may be used as a light apparatus or a bulb type and may also be used as the light source of a mobile terminal.

The light-emitting device includes a laser diode in addition to the aforementioned light-emitting diode.

Like the light-emitting device, the laser diode may include the first conductive type semiconductor layer, active layer and second conductive type semiconductor layer of the aforementioned structure. Furthermore, the laser diode uses an electro-luminescence phenomenon in which light is emitted when an electric current is applied after a p-type first conductive type semiconductor and an n-type second conductive type semiconductor are bonded, but is different from the light-emitting device in the direction and phase of emitted light. That is, in the laser diode, light having a single specific wavelength (monochromatic beam) can be discharged in the same phase and same direction using a phenomenon called stimulated emission and a reinforcement interference phenomenon. The laser diode may be used in optical communication or medical equipment and semiconductor processing equipment due to such characteristics.

An example of a light-receiving element may include a photodetector, that is, a kind of transducer for detecting light and converting the intensity of the light into an electrical signal. The photodetector includes a photoelectric cell (silicon, selenium), a photoconductive element (cadmium sulfide, cadmium selenide), a photodiode (PD) (for example, a PD having a peak wavelength in a visible blind spectral region or true blind spectral region), a phototransistor, a photomultiplier tube, a phototube (vacuum, gas sealing), an infra-red (IR) detector, etc., but the embodiment is not limited thereto.

Furthermore, in general, a semiconductor device, such as a photodetector, may be fabricated using a direct bandgap semiconductor having excellent optical conversion efficiency. Alternatively, the photodetector has various structures. The most common structure of the photodetector includes a pin type photodetector using a p-n junction, a Schottky type photodetector using a Schottky junction, and a metal semiconductor metal (MSM) type photodetector.

Like the light-emitting device, the photodiode may include the first conductive type semiconductor layer, active layer and second conductive type semiconductor layer of the aforementioned structure, and includes a p-n junction or a pin structure. The photodiode operates in response to a reverse bias or a zero bias. When light is incident on the photodiode, electrons and holes are generated and thus an electric current flows. In this case, the amount of current may be almost proportional to the intensity of light incident on the photodiode.

A photocell or solar cell is a kind of photodiode and can convert light into an electric current. Like the light-emitting device, the solar cell may include the first conductive type semiconductor layer, active layer and second conductive type semiconductor layer of the aforementioned structure.

Furthermore, the solar cell may be used as the rectifier of an electronic circuit through the rectification characteristic of a common diode using a p-n junction, and may be applied to an ultra-high frequency circuit and applied to an oscillation circuit, etc.

Furthermore, the aforementioned semiconductor device is not essentially implemented using a semiconductor only, and may further include a metal material. For example, a semiconductor device, such as a light-receiving element, may be implemented using at least one of Ag, Al, Au, In, Ga, N, Zn, Se, P and As, and may be implemented using a semiconductor material doped with a p type or n type dopant or an intrinsic semiconductor material. Although the embodiments have been chiefly described, they are only illustrative and are not intended to limit the present invention. A person having ordinary skill in the art to which the present invention pertains may understand that various modifications and applications not illustrated above are possible without departing from the essential characteristics of the present embodiments. For example, each of the elements described in the embodiments may be modified and implemented. Furthermore, differences related to such modifications and applications should be construed as belonging to the scope of the present invention defined in the appended claims.

The semiconductor device according to the embodiment can improve optical power and improve light efficiency by gradually reducing stress applied to the active layer.

Furthermore, the semiconductor device according to the embodiment can improve light efficiency by preventing a blue shift.

Furthermore, the semiconductor device according to the embodiment can improve the electrical characteristics and reliability of the semiconductor device by gradually reducing stain.

What is claimed is:
1. A semiconductor device, comprising:
a substrate;
a first conductive type semiconductor layer disposed on the substrate;

a semiconductor layer disposed on the first conductive type semiconductor layer, and having a first layer a second layer, and a third layer;

an active layer disposed on the semiconductor layer; and a second conductive type semiconductor layer disposed on the active layer, wherein time of flight-secondary ion mass spectroscopy (TOF-SIM) is used to direct a primary ion on to the semiconductor device to discharge secondary ions and obtain intensities of In ions and concentrations of Si ions detected as the secondary ions, wherein the active layer includes a first peak intensity of In ions, wherein the first layer includes a first peak concentration of Si ions, wherein the second layer includes a second peak intensity of In ions and a second peak concentration of Si ions, wherein the third layer includes a third peak intensity of In ions, wherein the first peak intensity of In ions includes a highest peak intensity of In ions in the semiconductor device, wherein the first peak concentration of Si ions includes a highest peak concentration of Si ions in the semiconductor device, wherein the second layer contacts the first layer, wherein the second peak concentration of Si ions overlaps with the second peak intensity of In ions spatially in the second layer, wherein the third peak intensity of In ions is disposed between the first peak intensity of In ions and the second peak intensity of In ions, wherein, when a first difference between the first peak intensity of In ions and the third peak intensity of In ions of the third layer is D1; and when a second difference between the first peak intensity of In ions and the second peak intensity of In ions of the second layer is D2, a ratio of D1 to D2 is about 1:2.

2. The semiconductor device of claim 1, wherein:
the first peak intensity of In ions of the active layer is the highest intensity of In ions in the semiconductor device.

3. The semiconductor device of claim 1, wherein an acceleration voltage for the primary ions is 20 to 30 keV,
wherein a radiation current is 0.1 pA to 5.0 pA, and
wherein a radiation area is about 20 nm×20 nm.

4. The semiconductor device of claim 1, wherein the first peak intensity of In ions of the active layer is greater than a highest intensity of In ions of the first layer, and
wherein the highest intensity of In ions of the first layer is greater than the second peak intensity of In ions of the second layer.

5. The semiconductor device of claim 1, wherein the active layer has a plurality of intensity of In ions, and
wherein the plurality of intensity of In ions of the active layer are about the same as the first peak intensity of In ions of the active layer.

6. The semiconductor device of claim 1, wherein the first layer has a plurality of intensity of In ions, and the plurality of intensity of In ions of the first layer are about the same as a highest intensity of In ions of the first layer, and
wherein the second layer has a plurality of intensity of In ions, and the plurality of intensity of In ions of the second layer are about the same as the second peak intensity of In ions of the second layer.

7. The semiconductor device of claim 1, wherein the first layer is interposed between the active layer and the second layer.

8. A semiconductor device, comprising:
a substrate;
a first conductive type semiconductor layer disposed on the substrate;
a semiconductor layer disposed on the first conductive type semiconductor layer; and
a second conductive type semiconductor layer disposed on the semiconductor layer,
wherein, using time of flight-secondary ion mass spectroscopy (TOF-SIM) to direct a primary ion on to the semiconductor device to discharge secondary ions and obtain a graph of a relative intensity of In ions detected as the secondary ions, the graph containing a plurality of infection points for the relative intensity of In ions in a depth direction of the semiconductor device,
the plurality of inflection points include:
a first grouping of inflection points having a first high point and a first low point,
a second grouping of inflection points having a second high point and a second low point,
a third grouping of inflection points having a third high point and a third low point, and
a fourth grouping of inflection points having a fourth high point and a fourth low point appearing,
wherein the first high point is higher than the second high point,
wherein the first grouping is further from the substrate than the second grouping,
wherein the second high point is higher than the third high point, and the third high point is higher than the fourth high point, and
wherein first, second, third and fourth groupings are further from the substrate in the order named.

9. The semiconductor device of claim 8, wherein the third high point is lower than the first low point.

10. The semiconductor device of claim 8, wherein the fourth high point is lower than the first low point and the second low point.

11. The semiconductor device of claim 8, wherein
when a first difference between the first high point and the third high is D1, and
when a second difference between the first high point and the fourth high point is D2,
a ratio of D1 to D2 is about 1:2.

12. The semiconductor device of claim 8, wherein an acceleration voltage for the primary ions is 20 to 30 keV,
wherein a radiation current is 0.1 pA to 5.0 pA, and
wherein a radiation area is about 20 nm×20 nm.

13. The semiconductor device of claim 8, wherein the first grouping of inflection points corresponds to the semiconductor layer, and the semiconductor layer is an active layer.

14. The semiconductor device of claim 8, wherein the first grouping corresponds to an active layer having a first In content,
wherein the second grouping corresponds to a first semiconductor layer having a second In content that is 60% to 80% of the first In content of the active layer,
wherein the third grouping corresponds to a second semiconductor layer having a third In content that is 20% to 30% of the first In content of the active layer or 30% to 40% of the second In content of the first semiconductor layer, and
wherein the fourth grouping corresponds to third semiconductor layer having a fourth In content that is 5% to 10% of the first In content of the active layer, or 20% to 30% of the third In content of the second semiconductor layer.

15. The semiconductor device of claim 8, wherein the first grouping corresponds to an active layer, the second grouping corresponds to a first semiconductor layer, the third grouping corresponds to a second semiconductor layer, and the fourth grouping corresponds to third semiconductor layer.

16. The semiconductor device of claim 15, wherein the active layer has a superlattice structure of InGaN/GaN and has a composition ratio of indium (In) of 14%.

17. The semiconductor device of claim 15, wherein the first semiconductor layer has a superlattice structure of InGaN/GaN and has a composition ratio of indium (In) of 6% to 9%.

18. The semiconductor device of claim 15, wherein the second semiconductor layer has a superlattice structure of InGaN/GaN and has a composition ratio of indium (In) of 3% to 6%.

19. The semiconductor device of claim 15, wherein the third semiconductor layer has a superlattice structure of InGaN/GaN and has a composition ratio of indium (In) of 1% to 3%.

\* \* \* \* \*